US005930826A

United States Patent [19]

Lee et al.

[11] Patent Number: 5,930,826

[45] Date of Patent: Jul. 27, 1999

[54] FLASH MEMORY PROTECTION ATTRIBUTE STATUS BITS HELD IN A FLASH MEMORY ARRAY

[75] Inventors: Peter Wung Lee, Saratoga, Calif.; Fu-Chang Hsu; Hsing-Ya Tsao, both of Taipei, Taiwan

[73] Assignee: Aplus Integrated Circuits, Inc., Santa Clara, Calif.

[21] Appl. No.: 08/833,599

[22] Filed: Apr. 7, 1997

[51] Int. Cl.[6] .................... G06F 12/14

[52] U.S. Cl. .................... 711/163; 711/103

[58] Field of Search .................... 711/163, 103

[56] References Cited

U.S. PATENT DOCUMENTS

| | | | |
|---|---|---|---|
| 4,775,958 | 10/1988 | Hashimoto | 365/185.2 |
| 4,821,240 | 4/1989 | Nakamura et al. | 365/195 |
| 5,053,990 | 10/1991 | Kreifels et al. | 711/103 |
| 5,337,281 | 8/1994 | Kobayashi et al. | 365/185.13 |
| 5,369,754 | 11/1994 | Fandrich et al. | 711/103 |
| 5,530,827 | 6/1996 | Matsui et al. | 711/103 |
| 5,619,461 | 4/1997 | Roohparvar | 365/201 |
| 5,644,533 | 7/1997 | Lancaster et al. | 365/185.18 |
| 5,646,890 | 7/1997 | Lee et al. | 365/185.11 |
| 5,687,121 | 11/1997 | Lee et al. | 365/185.11 |
| 5,748,538 | 5/1998 | Lee et al. | 365/185.06 |

*Primary Examiner*—John W. Cabeca
*Assistant Examiner*—Felix B. Lee

[57] ABSTRACT

Flash memory circuits provide sector protection or file protection with protection attribute status bits held in a flash memory array. The sector protection protects memory data based on the physical location of the data. The flash memory array is divided into a number of memory sectors. Each memory sector can be protected independently. The size of the memory sector is flexible and may be as large as the whole memory array or as small as a single bit group. Each memory sector has protection bits stored in a protection bit array for indicating the protection state of the sector. A parallel protection structure providing both sector protection and block protection is also included. The parallel protection allows small size data protection as well as large size block protection. File protection protects memory data on a file basis regardless of the physical location of the data. Each file has protection bits stored in an attribute memory for indicating the protection state of the file. The attribute memory is made from part of the flash memory which simplifies the process of manufacturing the memory. It also reduces the area size of the attribute memory and the complexity of the control circuits.

12 Claims, 4 Drawing Sheets

FLASH MEMORY PROTECTION ATTRIBUTE STATUS BITS HELD IN A FLASH MEMORY ARRAY

FIELD OF INVENTION

The present invention relates to the design and circuit structure of a flash memory, and more specifically to the protection of memory data stored in the flash memory.

BACKGROUND OF THE INVENTION

In recent years, flash memory devices have been widely used in computer related equipment and other electronics appliances as storage devices. The nonvolatile and on-chip programmable capabilities of a flash memory are very important for storing data in many applications. As an example, flash memories are frequently used for the BIOS storage of a personal computer. In addition, the small physical size of flash memories also makes them very suitable for portable applications. Therefore, they have been used for storing programs and data for many portable electronic devices such as cellular phones, digital cameras and video game platforms.

The popularity of flash memories in many different applications has raised an important issue regarding data security in using these memory devices. For some applications such as BIOS, the stored codes are designed to be unchangeable. For other applications such as games, it is desirable that the stored codes are not only unchangeable but also unreadable. Therefore, different mechanisms for providing flash memory data protection have been presented and used by memory manufacturers. Two approaches to protecting the memory data are generally available. One approach provides sector protection and the other provides file protection.

For flash memories with sector protection, the data stored in certain physical locations are protected together. The memory array is divided into a number of sectors. Both erase and program operations in any combination of the sectors can be disabled. Users determine if each sector should be protected. The state of protection for each sector is programmed and stored in the memory chip. Whenever an erase or program operation is to be executed, the information regarding the protection state of the selected sector is checked first. If the selected sector is protected, the operation will be disabled without execution.

Different from a normal random access memory (RAM) that can be randomly read, erased and programmed on a byte basis, a conventional flash memory features a byte-program and a sector-erase capability with each sector containing a number of bytes. Because the data within a sector can not be selected for erasure individually, a flash memory has to erase the data of a whole sector, i.e., an erase sector, and then program the new data byte by byte. As can be easily seen, the smaller the size of a protection sector, the more flexible is the configuration of the flash memory. However, the size of a protection sector is always limited to a number greater than the size of an erase sector. Typically, a protection sector contains a number of erase sectors. The large size of a protection sector makes the flash memory very inflexible and inefficient. For example, the size of a protection sector (protection size) of a 16M byte flash memory device may be 512 word lines that includes 2M bytes of memories. If 10K data have to be protected from being read, the other 1.99M bytes of flash memory cells in the same sector will not be readable either.

In contrast to the sector protection approach, the second approach protects the data of a file regardless of the physical location of the data in the flash memory. It uses an extra memory called attribute memory to store much information of a file, including the protection information, the starting address, the ending address, the defect information, erase/program counts, . . . , etc. When a file is accessed, its information is retrieved from the attribute memory first. If the information shows that the file is protected, the erase and program operations will be disabled. In some applications, the contents of the attribute memory are read out and temporarily stored in an external system.

Because the attribute memory needs to be updated frequently, a flash memory is not appropriate for serving as an attribute memory due to the limitation in the size of an erase sector. As a result, the prior arts proposed using an electrical-erasable-programmable-read-only-memory (EEPROM) instead of a flash memory for the attribute memory. However, this approach requires two different memory technologies to be used on one memory chip. The fabrication process of such a memory device is not only difficult but also expensive. In addition, each cell of an EEPROM consists of two transistors which result in larger cell area in manufacturing the device.

SUMMARY OF THE INVENTION

This invention has been made to overcome the above mentioned drawbacks of a conventional flash memory. The primary object of this invention is to provide a circuit structure for the sector protection of a flash memory with a small and flexible protection size. Another object of this invention is to provide a circuit structure that uses a flash memory as an attribute memory for the file protection of a flash memory.

Based on the flash memory disclosed in two U.S. Pat. No. 5,646,890 and U.S. Pat. No. 5,687,121 that have been assigned to the same assignee of this invention, a novel approach to protecting flash memory data with a small and flexible size for the protection sector is presented. The word line (WL) latches and the source line latches in the referenced U.S. patents make it possible for the flash memory to use a very flexible size for an erase sector. Therefore, this invention divides the flash memory into small memory sectors for protection. A protection bit array stores the protection information of each memory sector. When an erase or program operation is requested, the corresponding protection bit of the memory sector is checked first. If the protection bit indicates that the data should be protected, the erase or program operation is terminated by disabling the word line latch and the source line latch.

The present invention also presents a parallel protection structure that provides both sector protection and block protection. The block protection groups a number of word lines together as a memory block. Block protection bits are used to indicate the state of protection for each block. Hence, the protection of a memory block can be more efficiently done by erasing or programming the block protection bits instead of the protection bits of a large number of sectors. The block protection bits can be stored in the same protection bit array that stores the protection bits of memory sectors or in a separate block protection bit array.

According to this invention, the flash memory can be used as the attribute memory for the file protection of flash memories because the size of an erase sector has been made small and flexible. Based on the source line structure of the referenced U.S. Pat. No. 5,646,890, the flash memory can be read, erased and programmed byte by byte. The requirement of using EEPROM as the attribute memory for the conventional file protection is eliminated.

DETAILED DESCRIPTION OF THE INVENTION

U.S. Pat. No. 5,646,890 discloses a flash memory having latch structures in source lines for separately erasing cells on a same word line in the flash memory. U.S. Pat. No. 5,687,121 presents a flash memory word line decoder having latch structures in the word lines for providing random and multiple word line erasure. The two U.S. patents together provide a small (multiple bytes) and flexible (random and multiple word lines) erase size for the erase operation of a flash memory.

Based on the small and flexible erase size, this invention presents a novel approach to protecting flash memory data with a small and flexible size for the protection sector. The protection size of this invention can be one word line, one half of a word line, one quarter of a word line or as small as a single byte. The trade-off is that a smaller protection size would require higher circuit overheads. The small and flexible erase size also allows this invention to provide an improvement for the mechanism of file protection in flash memories. The preferred embodiments for both sector protection and file protection are disclosed in this application.

EMBODIMENT 1

SECTOR PROTECTION

Figure 1:
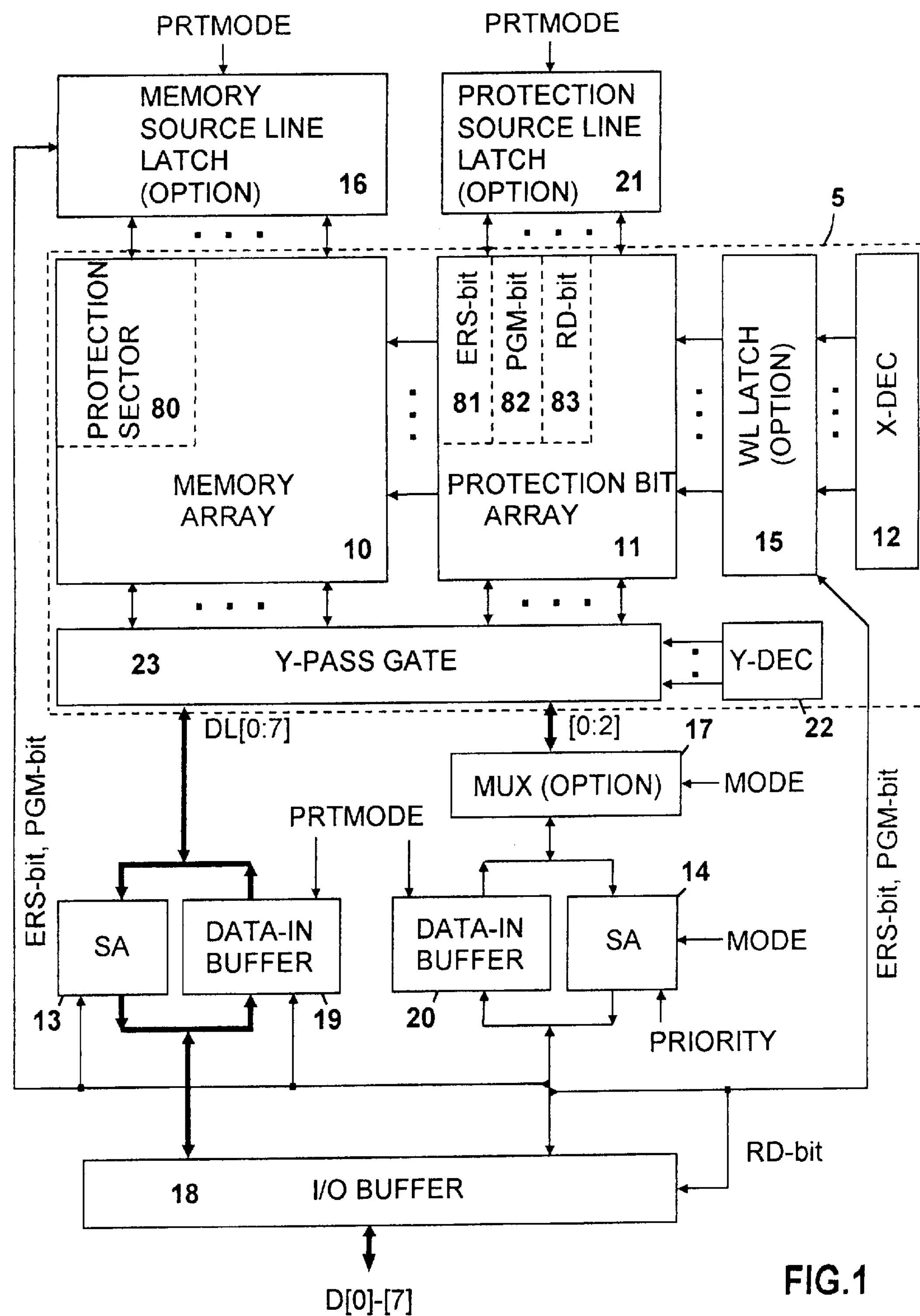
FIG. 1 shows the block diagram of a preferred embodiment of this invention comprising sector protection.

FIG. 1 shows a block diagram of the preferred embodiment for implementing sector protection of flash memories of this invention. A memory array 10 is divided into a plurality of sectors 80. The approach disclosed in this invention allows each memory sector to be independently protected from being erased, programmed or read. Therefore, any type of desired data protection can be accomplished by combining the independent protection of each operation together. In the example shown in FIG. 1, the three operations are protected independently.

The protection information of each memory sector is stored in the protection bit array 11. The protection bit array 11 comprises three bits of information, i.e., ERS-bit 81, PGM-bit 82 and RD-bit 83, for indicating the protection state of erase, program, and read operations respectively for each sector. The memory sector 80 and its protection bits 81–83 have the same address but different sense amplifiers. When a memory sector is accessed, its protection bits are also accessed. The data of a sector are read to a memory sense amplifier 13, and the protection bits are read to a protection sense amplifier 14, respectively. Before any further operation on the data of the selected sector is executed, the corresponding protection bit is examined first. If it shows that the selected sector is protected, the operation will be terminated.

With reference to FIG. 1, the protection of an erase operation in this embodiment is described first. A word line latch 15 as disclosed in the U.S. Pat. No. 5,646,890 is used for providing random and multiple word line erase operation. A memory source line latch 16 as disclosed in the U.S. Pat. No. 5,687,121 further provides the erase operation of selected memory cells within a word line. Both word line and memory source line latches are optional in this embodiment. An X-decoder 12 selects the word line latch 15 to provide random and multiple word lines with erase voltages. A Y-decoder 22 and a Y-pass gate 23 select the memory source line latch 16 to provide the source lines of random and multiple bytes with erase voltages. The minimum protection size of the erase operation can be limited by reducing the number of the source line latches. For example, if it is decided that the protection size of the flash memory will be one quarter of a word line, providing one source line latch for each quarter of a word line is sufficient for the protection.

When a memory sector is selected, its corresponding protection bits are also read to the protection sense amplifier 14 as described above. In order to reduce the number of protection sense amplifiers, the embodiment as shown in FIG. 1 also provides an optional multiplexer 17 to allow the sharing of a protection sense amplifier 14 in different modes of operation. According to a MODE signal, the multiplexer 17 can be controlled to pass only the ERS-bit 81. The ERS-bit 81 provides a feedback signal to the word line latch 15 and the memory source line latch 16 to disable the selection of the sector. Therefore, the sector will not be selected for erasure. In the mean time, the ERS-bit 81 is also sent to an input/output (I/O) buffer 18 to inform an external controller that the selected sector is protected. The memory sense amplifier 13 of the memory array is disabled.

As mentioned above, both the word line and source line latches shown in this embodiment are optional for providing random, multiple and small size data protection. The invention can also be applied to conventional flash memories which do not have the two latch circuits. Under those circumstances, the ERS-bit 81 provides feedback for disabling the selection of the X-decoder 12 instead of the two latch circuits. The conventional flash memories can, therefore, be protected from being erased.

The principle of the protection of a program operation in this embodiment is almost identical except that the PGM-bit 82 is checked instead of the ERS-bit 81. When the sector protection of a program operation is desired, the PGM-bit 82 provides a feedback signal to the word line latch 15 and the memory source line latch 16 to disable the selection of the sector. In addition, the PGM-bit 82 is also used to disable a memory data-in buffer 19 to block the input data and the program operation is terminated.

In general, an EPROM-type (ETOX) flash memory transfers data on a byte basis. Either one or multiple bytes are read to the I/O buffer 18 at one time. A sector may contain several bytes. As discussed earlier, the protection bits of this invention have the same address as the memory sector. Therefore, when any byte of a sector is selected, the corresponding protection bits are also selected. The memory data and protection bits are read to the memory sense amplifier 13 and the protection sense amplifier 14 respectively. According to the MODE signal, the RD-bit 83 is passed to the protection sense amplifier 14 if a read operation is requested. If the RD-bit 83 indicates that the sector protection of the read operation is required, the I/O buffer 18 will be disabled and no valid data can be read.

As mentioned in a previous section, the protection size of this invention can be one word line, one half of a word line, one quarter of a word line or as small as a single byte. In some cases, however, it may be desirable to protect a large size block of data in a flash memory. As an example, in a system which prefers that a block of 2M byte memory data (512 word lines) be protected all together, it will be very inefficient if a 16M byte memory array having 4K byte (1 word line) protection size is used because the protection bits of all the 512 word lines have to be erased and programmed at all times. Hence, this invention also provides a parallel structure for large size protection. Users can select different protection sizes based on the requirement in their applications.

Figure 2:
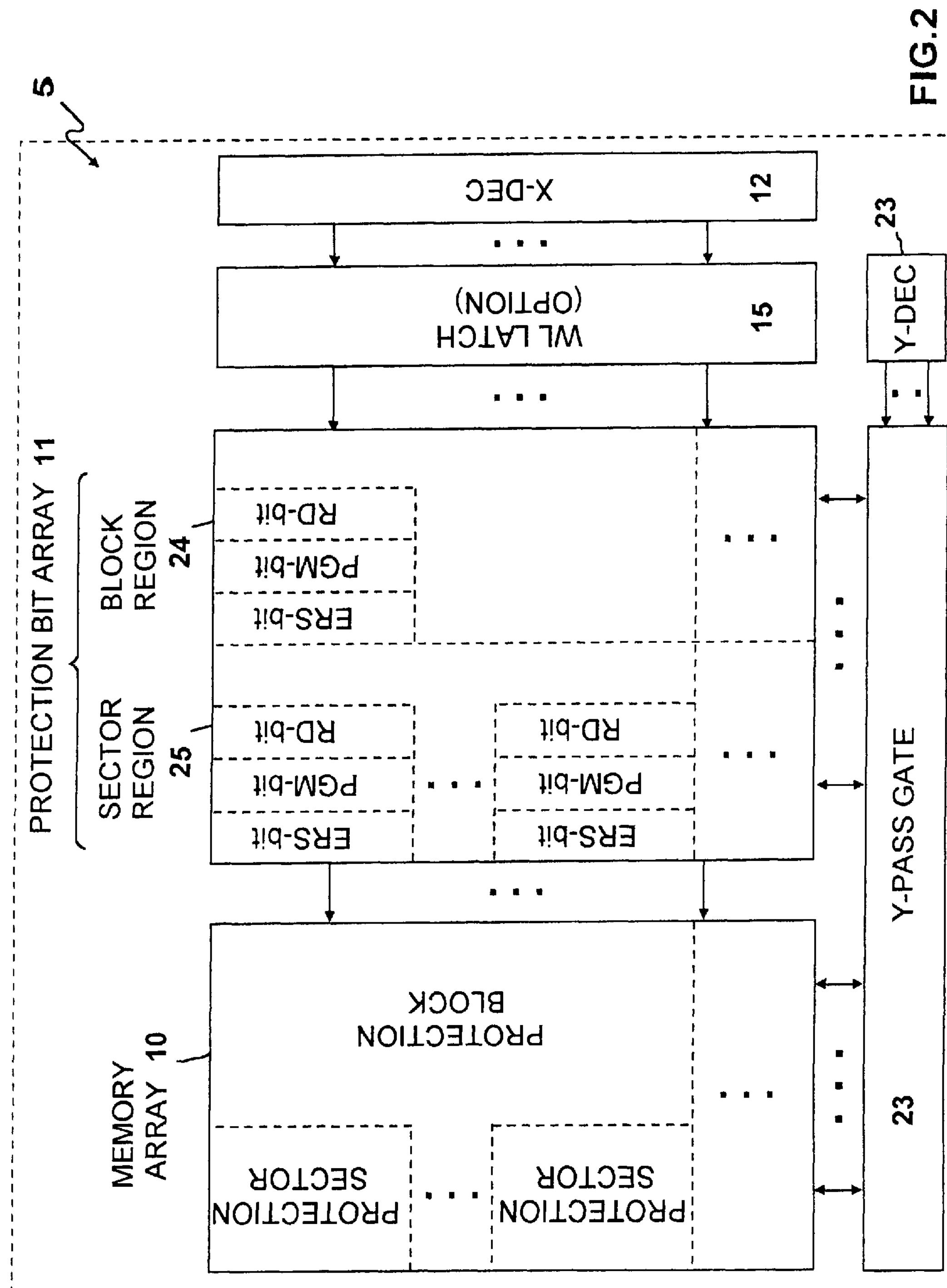
FIG. 2 shows the block diagram of an embodiment of this invention comprising parallel structures for both sector protection and block protection.

The parallel protection structure of this invention offers both one word line protection size and a block of word line protection size in a memory array. A number of word lines such as 512 word lines are grouped into a block. Similar to a protection sector, each protection block has three protection bits for indicating its corresponding protection state. There are two approaches to storing and retrieving the block protection bits. The first approach stores the block protection bits and the sector protection bits in the protection bit array 11 as shown in FIG. 2. The protection bit array is divided into a sector region 25 and a block region 24 If the block size is 512 word lines, the block protection bits are stored in a place having the address of the first word line of the 512 word line block.

Whenever a word line in the block is selected, the first word line of the block is read and the block protection bits are checked. In order to read the block protection bits stored in the first word line, the least significant bits of the memory address are replaced with zeroes. For example, for a block having 512 word lines, the least significant 9 bits are replaced with zeroes. For a block having 16 word lines, the least significant 4 bits are replaced with zeroes. The original least significant bits of the memory address are stored in an address register. If the block protection bits show that the block is unprotected, the address register will release the least significant bits for the continuing operation to proceed. Otherwise, the operation is terminated.

Figure 3:
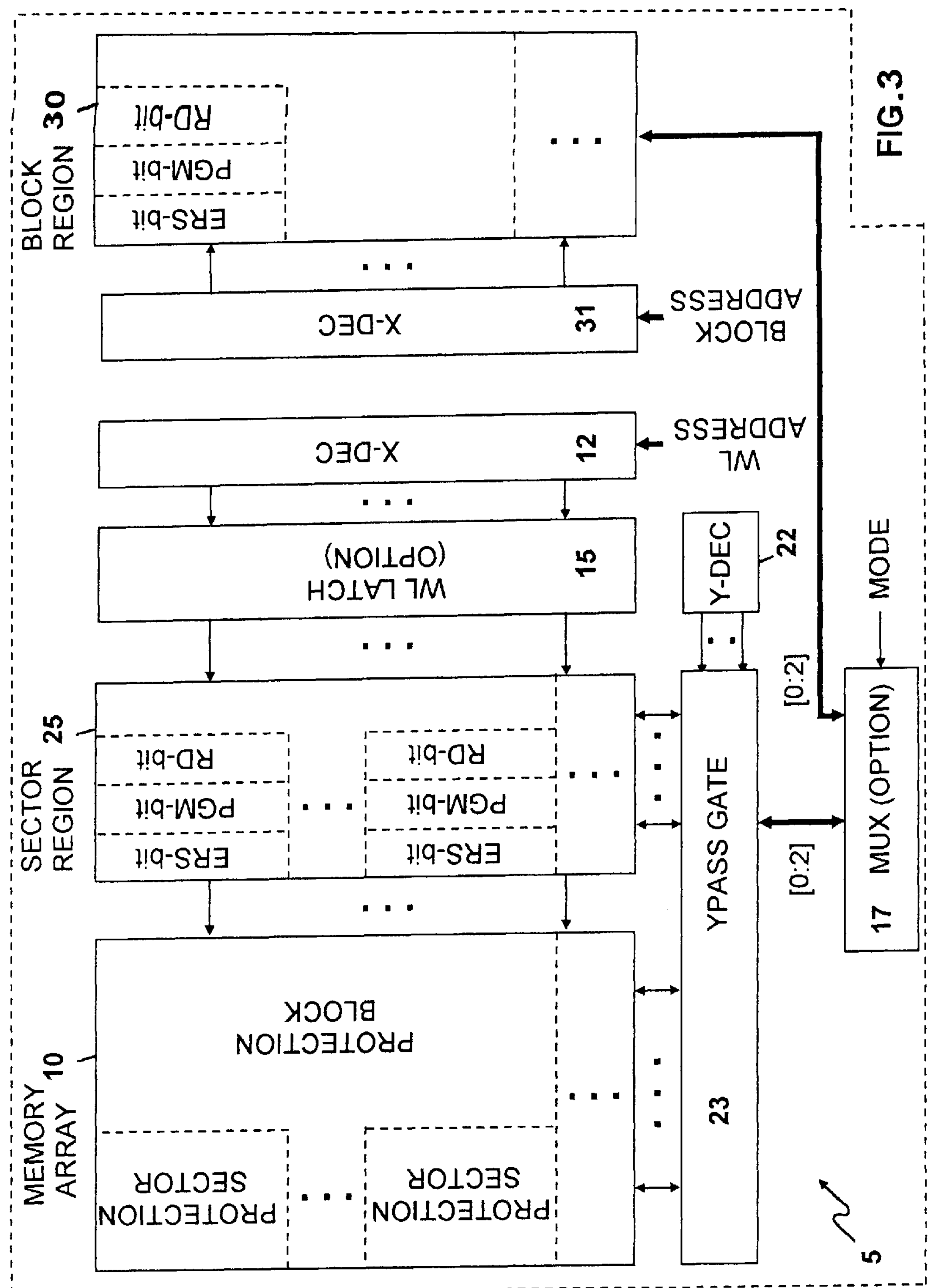
FIG. 3 shows the block diagram of an alternative embodiment of this invention comprising parallel structures for both sector protection and block protection.

Another approach stores the protection bits in a separate array outside the protection bit array. With reference to FIG. 3, the block protection bits are stored in a separate block region 30 a block protection bit array. The address of the block protection bits of each block is the same address as the first word line of the block. The block protection bit array shares the protection sense amplifier 14 with the protection bit array 11 by means of the multiplexer 17. The block protection bit array is controlled by a block X-decoder 31 which only decodes the most significant bits of the memory address. Therefore, the full memory address is directly sent to the X-decoder 12 and the most significant bits are sent to the block X-decoder 31 simultaneously. If the block protection bits show that the block is unprotected, the continuing operation proceeds. Otherwise, the operation is terminated.

The advantage of the second approach is that both the block region 30 and the normal memory array 10 can be accessed simultaneously. The operation speed is higher than the first approach. Because only three more protection bits are added in the block protection bit array for each block, the overhead imposed by the parallel protection structure is only approximately 0.1% of the total circuit. This approach not only makes the invention compatible with the large protection size of conventional flash memories but also provides more flexibility of a small protection size.

The protection bit array of this invention is part of the flash memory. Therefore, the protection bits are nonvolatile and can be erased and programmed as other normal flash cells. However, the protection bits can only be changed during a special protection mode. In a normal mode, they behave like a read only memory (ROM) for providing the protection information for the normal memory array.

The normal memory array and the protection bit array have their respective data-in buffers 19, 20 and source line latches 16, 21 to control their erase and program operations. In a normal node, a signal PRTMODE disables the protection data-in buffer 20 and the protection source line latch 21 of the protection bit array as well as enables the memory data-in buffer 19 and the memory source line latch 16 of the normal memory array. In a protection mode, the signal PRTMODE disables the data-in buffer and the source line latch of the normal memory array and enables those of the protection bit array.

Because of the PRTMODE signal, erasing or programming a wrong memory cell will not occur although the protection bit array and the normal memory array have the same address. The disabled data-in buffer and source line latch will provide inhibit voltage to disable the flash memory cells even if the memory cells that are not supposed to be changed are selected. It is also preferred that the PRTMODE signal can only be generated by a series of commands in order to prevent unintentional changes of the protection bits.

In some cases, the data stored in a normal memory array may have to be accessed in spite of the fact that they are protected by the protection bits. For example, a system engineer may need to read or even change protected data without erasing the setting of the corresponding protection bits. Therefore, a signal PRIORITY is provided in this invention for disabling the protection sense amplifier 14. When the PRIORITY signal is issued, the protection sense amplifier 14 is disabled and the ERS-bit 81, PGM-bit 82, and RD-bit 83 can not be read from the protection bit array 11. A state showing that the selected memory sector is unprotected is always sent out from the protection sense amplifier 14. The selected memory sector can, therefore, be erased, programmed or read. The PRIORITY signal should only be issued by authorized persons.

In some applications, the protection function is not required. The protection bit array of this invention can serve as a regular memory array to increase the memory capacity. Under this circumstance, the PRORITY signal can be used to disable all the protection mechanism as described in the previous section so that the normal memory array can be accessed without protection. The signal PRTMODE can be used to distinguish the access of either the normal memory array or the protection bit array. When the protection bit array is selected, it is erased and programmed as in the protection mode. For a read operation of the protection bit array, the memory sense amplifier 13 of the normal memory array is disabled and the data stored in the protection bit array is read out from the protection sense amplifier 14 to the I/O buffer 18.

EMBODIMENT 2

ATTRIBUTE MEMORY

The second embodiment of this invention relates to file protection of flash memories. As described in the background of the invention, file protection approach protects the data of a file regardless of the physical location of the data in the memory. An extra memory called attribute memory is required for storing the file information including the protection information, the starting address, the ending address and other information. An attribute memory is frequently updated. In the prior arts, EEPROM is used as the attribute memory because conventional flash memories have a large size erase sector and can not be updated efficiently.

Figure 4:
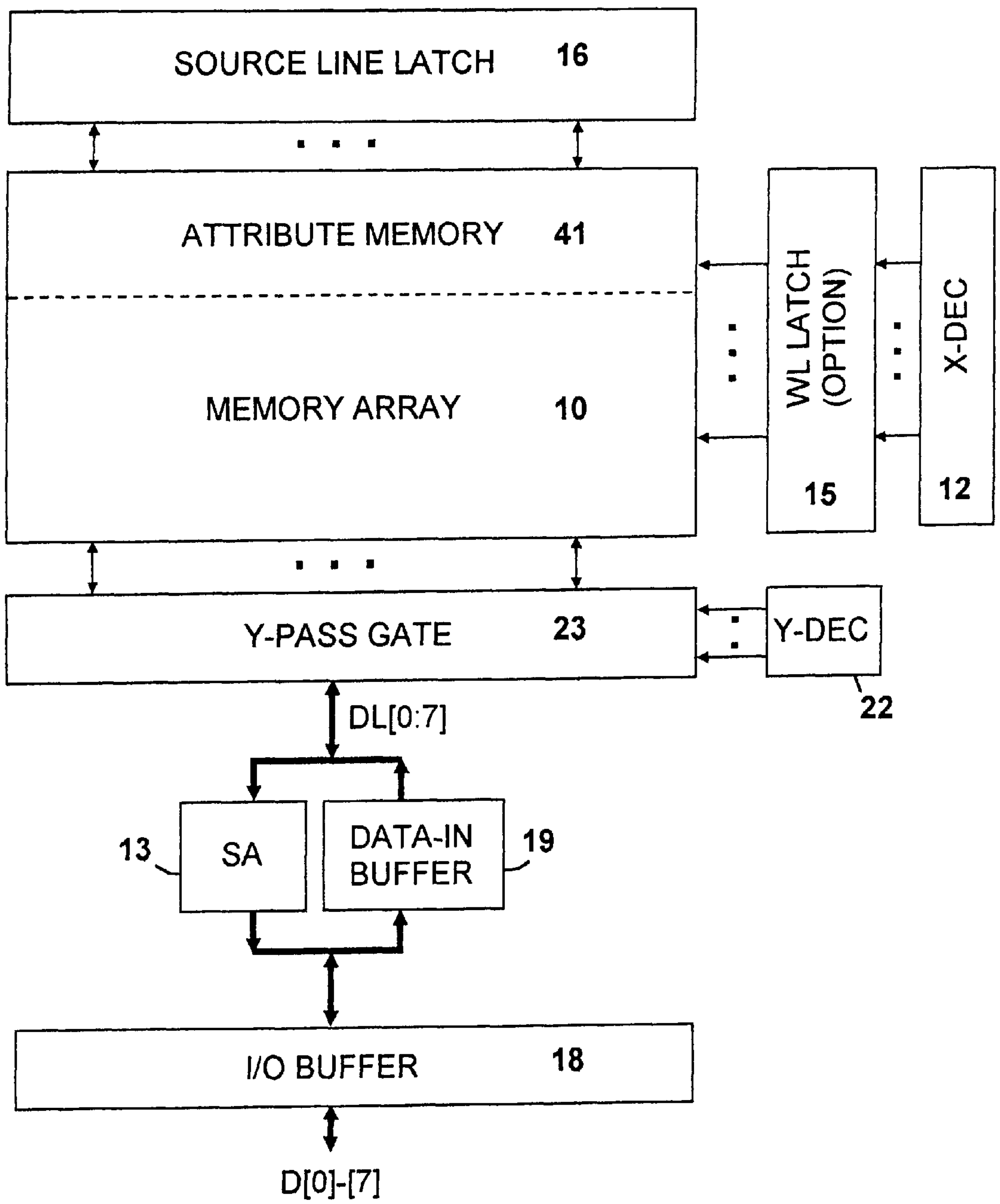
FIG. 4 shows the block diagram of another preferred embodiment of this invention comprising file protection using flash memories as the attribute memories.

The file protection approach of this invention uses a flash memory as the attribute memory. As discussed earlier, the U.S. Pat. No. 5,646,890 provides a flash memory having latch structures in source lines for erasing memory cells separately within a word line. Based on the source line latch structure, the flash memory can be erased or programmed byte by byte similar to an EEPROM. Therefore, using this type of flash memories as attribute memories is appropriate. FIG. 4 shows a block diagram of the embodiment of the file protection of this invention. As shown in FIG. 4, a part of the flash memory array is used as the attribute memory 41.

The file protection of a flash memory in this invention provides several advantages over conventional file protection. Because the attribute memory is also a flash memory, manufacturing the memory chip requires only one process technology. Conventional file protection using EEPROM as the attribute memory requires two very different process technologies. The manufacturing cost of the flash memory of this invention is greatly reduced.

Because an EEPROM has two transistors in each cell and a flash memory has only one transistor per cell, the size of an attribute memory using an EEPROM memory is approximately twice as large as an attribute memory using a flash memory. Therefore, another advantage of this invention is that the memory size is significantly reduced compared to the conventional file protection using an EEPROM as its attribute memory. Although this invention requires source line latches for the flash memory, the EEPROM memory also requires latch circuits for each byte. The source line latches do not introduce more circuit overhead.

The flash attribute memory of this invention can be part of the main memory. Thus, no additional circuit is required. In contrast, the EEPROM can not be built into the main flash memory because they have different cell structures, cell sizes, read/write operations, read/write voltages, and process technologies, . . . , etc. In addition, the EEPROM can not share the peripheral control circuits with the main flash memory. It requires large additional control circuits for the memory operation. Therefore, the control circuit and area overhead is large.

While the invention has been particularly shown and described with reference to these preferred embodiments, it will be understood by those skilled in the art that various changes in form and details may be made without departing from the spirit and scope of the invention. As an example, although the embodiments 1 and 2 are disclosed separately in this specification, they can also be combined in one memory to provide double protection.

What is claimed is:

1. A flash memory circuit comprising:

a memory array being divided into a plurality of memory sectors, each memory sector having a flexible size and comprising one or more flash memory cells of a word line;

a protection bit array comprising a plurality of flash memory cells being divided into a plurality of sector protection bit groups, each sector protection bit group having protection bits including an ERS bit, a PGM bit and an RD bit for storing the protection information of an associated memory sector in said memory array, and each sector protection bit group and its associated memory sector being of a same flash memory type and sharing a same word line address;

an X decoder and a Y decoder decoding a memory address for selecting a flash memory cell in said memory array and an associated sector protection bit group in said protection bit array, said associated sector protection bit group storing the protection information of a memory sector comprising said selected flash memory cell;

a Y pass gate controlled by said Y decoder for passing the output data of a selected flash memory cell to a memory sense amplifier or sending input data from a memory data-in buffer to a selected flash memory cell, said Y pass gate also passing the protection bits of a protection bit group to a protection sensing and buffering means or sending input data from said protection sensing and buffering means to a protection bit group, said protection sensing and buffering means sending a protection bit output to said memory sense amplifier, said memory data-in buffer and said X decoder, said protection bit output being an ERS protection output, a PGM protection output or an RD protection output dependent on a MODE signal sent to said protection sensing and buffering means;

an input/output buffer coupled to said memory sense amplifier, said memory data-in buffer, said protection sensing and buffering means for buffering output data sent from said memory array or said protection bit array to an external circuit, or buffering input data sent from an external circuit to said memory array or said protection bit array;

and a PRTMODE input for disabling said protection sensing and buffering means and enabling said memory sense amplifier and said memory data-in buffer in a normal mode, and enabling said protection sensing and buffering means and disabling said memory sense amplifier and said memory data-in buffer in a protection mode;

wherein said memory sense amplifier and said X decoder are disabled by an ERS protection output if the flash memory cell being selected is protected from being erased, said memory data-in buffer and said X decoder are disabled by a PGM protection output if the flash memory cell being selected is protected from being programmed, or said input/output buffer is disabled by an RD protection output if the flash memory cell being selected is protected from being read.

2. The flash memory circuit according to claim 1, further comprising a PRIORITY input for disabling the protection bit output of said protection sensing and buffering means.

3. The flash memory circuit according to claim 1, wherein said protection sensing and buffering means comprises a protection sense amplifier for outputting a protection bit output, a multiplexer for receiving a protection bit group from said Y pass gate and sending an ERS bit, a PGM bit, or an RD bit to said protection sense amplifier according to said MODE signal, and a protection data-in buffer for sending input data through said multiplexer and Y pass gate to a protection bit group.

4. The flash memory circuit according to claim 1, wherein said protection sensing and buffering means comprises an ERS protection sense amplifier, a PGM protection sense amplifier and an RD protection sense amplifier for receiving an ERS bit, a PGM bit, or an RD bit of a protection bit group respectively from said Y pass gate and outputting a protection bit output according to said MODE signal, and a protection data-in buffer for sending input data through Y pass gate to a protection bit group.

5. The flash memory circuit according to claim 1, wherein said memory array further comprises a plurality of memory blocks each having a plurality of memory sectors; said protection bit array further comprises a plurality of block protection bit groups each having block protection bits including an ERS bit, a PGM bit and an RD bit for storing the protection information of an associated memory block in said memory array, each block protection bit group and its associated memory block being of a same flash memory type and sharing a same word line address except that the lowest significant bits of the word line address of a block protection bit group are replaced with zeroes.

6. The flash memory circuit according to claim 1, further comprising:

a block protection bit array comprising a plurality of flash memory cells being divided into a plurality of block protection bit groups, each block protection bit group having protection bits including an ERS bit, a PGM bit and an RD bit for storing the protection information of an associated memory block in said memory array, each memory block being formed by a plurality of memory sectors in said memory array, and each block protection bit group and its associated memory block being of a same flash memory type and sharing a same word line address except that the lowest significant bits of the word line address of a block protection bit group are replaced with zeroes; and a block X decoder for decoding the word line address for said block protection bit array and selecting a block protection bit group;

wherein said block protection bit array is connected to said protection sensing and buffering means.

7. The flash memory circuit according to claim 1, further comprising:

a word line latch structure coupled to the word lines of said memory array and said protection bit array and receiving the protection bit output from said protection sensing and buffering means, said word line latch structure being connected to said X decoder and providing a random and multiple selection of word lines from said memory array and said protection bit array;

a memory source line latch structure coupled to the source lines of said memory array and receiving the protection bit output from said protection sensing and buffering means, said memory source line latch structure providing the selection of at least one memory source line from said memory array;

a protection source line latch structure coupled to the source lines of said protection bit array, said protection source line latch structure providing the selection of at least one protection source line from said protection bit array;

wherein said word line latch structure and said memory source line structure are disabled by an ERS protection output if the flash memory cell being selected is protected from being erased, or said word line latch structure and said memory source line latch structure are disabled by a PGM protection output if the flash memory cell being selected is protected from being programmed.

8. The flash memory circuit according to claim 7, further comprising a PRIORITY input for disabling the protection bit output of said protection sensing and buffering means.

9. The flash memory circuit according to claim 7, wherein said protection sensing and buffering means comprises a protection sense amplifier for outputting a protection bit output, a multiplexer for receiving a protection bit group from said Y pass gate and sending an ERS bit, a PGM bit, or an RD bit to said protection sense amplifier according to said MODE signal, and a protection data-in buffer for sending input data through said multiplexer and Y pass gate to a protection bit group.

10. The flash memory circuit according to claim 7, wherein said protection sensing and buffering means comprises an ERS protection sense amplifier, a PGM protection sense amplifier and an RD protection sense amplifier for receiving an ERS bit, a PGM bit, or an RD bit of a protection bit group respectively from said Y pass gate and outputting a protection bit output according to said MODE signal, and a protection data-in buffer for sending input data through Y pass gate to a protection bit group.

11. The flash memory circuit according to claim 7, wherein said memory array further comprises a plurality of memory blocks each having a plurality of memory sectors; said protection bit array further comprises a plurality of block protection bit groups each having block protection bits including an ERS bit, a PGM bit and an RD bit for storing the protection information of an associated memory block in said memory array, each block protection bit group and its associated memory block being of a same flash memory type and sharing a same word line address except that the lowest significant bits of the word line address of a block protection bit group are replaced with zeroes.

12. The flash memory circuit according to claim 7, further comprising:

a block protection bit array comprising a plurality of flash memory cells being divided into a plurality of block protection bit groups, each block protection bit group having protection bits including an ERS bit, a PGM bit and an RD bit for storing the protection information of an associated memory block in said memory array, each memory block being formed by a plurality of memory sectors in said memory array, and each block protection bit group and its associated memory block being of a same flash memory type and sharing a same word line address except that the lowest significant bits of the word line address of a block protection bit group are replaced with zeroes; and a block X decoder for decoding the word line address for said block protection bit array and selecting a block protection bit group;

wherein said block protection bit array is connected to said protection sensing and buffering means.

* * * * *